United States Patent
Frutschy et al.

(10) Patent No.: US 6,750,551 B1
(45) Date of Patent: Jun. 15, 2004

(54) DIRECT BGA ATTACHMENT WITHOUT SOLDER REFLOW

(75) Inventors: Kristopher Frutschy, Phoenix, AZ (US); Charles A. Gealer, Phoenix, AZ (US); Carlos A. Gonzalez, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/473,305

(22) Filed: Dec. 28, 1999

(51) Int. Cl.[7] .......................... H01L 23/48; H01L 23/52; H01L 29/40
(52) U.S. Cl. .................. 257/785; 257/712; 257/713; 257/718; 257/727; 257/731; 257/733; 257/737; 257/780; 257/717; 257/738; 257/719; 257/778
(58) Field of Search ................. 257/785, 712, 257/713, 723, 717–719, 737, 738, 780, 778, 731, 733, 727, 736; 361/764

(56) References Cited

U.S. PATENT DOCUMENTS

| | | | | |
|---|---|---|---|---|
| 4,878,846 A | * | 11/1989 | Schroeder ............... 439/65 |
| 4,940,181 A | | 7/1990 | Juskey, Jr. et al. | |
| 5,329,423 A | * | 7/1994 | Scholz .................. 361/760 |
| 5,400,220 A | | 3/1995 | Swamy | |
| 5,625,298 A | * | 4/1997 | Hirano et al. ........... 324/754 |
| 5,634,267 A | * | 6/1997 | Farnworth et al. ......... 29/840 |
| 5,714,803 A | | 2/1998 | Queyssac | |
| 5,736,456 A | * | 4/1998 | Akram .................. 438/614 |
| 5,783,461 A | * | 7/1998 | Hembree ................ 438/17 |
| 5,786,635 A | * | 7/1998 | Alcoe et al. ............. 257/718 |
| 5,812,378 A | * | 9/1998 | Fjelstad ................. 361/769 |
| 5,834,335 A | * | 11/1998 | Buschbom .............. 438/107 |
| 5,907,474 A | | 5/1999 | Dolbear | |
| 5,931,685 A | * | 8/1999 | Hembree et al. .......... 439/74 |
| 5,947,751 A | | 9/1999 | Massingill | |
| 5,949,137 A | * | 9/1999 | Domadia et al. .......... 257/712 |
| 6,137,161 A | * | 10/2000 | Gililand et al. .......... 257/678 |

FOREIGN PATENT DOCUMENTS

| | | |
|---|---|---|
| JP | 10303345 A | 11/1998 |
| WO | 95/26851 | 10/1995 |

* cited by examiner

Primary Examiner—Olik Chaudhuri
Assistant Examiner—Nitin Parekh
(74) Attorney, Agent, or Firm—Robert G. Winkle

(57) ABSTRACT

A surface mount-type microelectronic component assembly which does not physically attach the microelectronic component to its carrier substrate. Electrical contact is achieved between the microelectronic component and the carrier with solder balls attached to either the microelectronic component or the carrier substrate. A force is exerted on the assembly to achieve sufficient electrical contact between the microelectronic component and the carrier substrate.

11 Claims, 11 Drawing Sheets

DIRECT BGA ATTACHMENT WITHOUT SOLDER REFLOW

BACKGROUND OF THE INVENTION

1. Field of the Invention

The present invention relates to apparatus and processes for packaging microelectronic device. In particular, the present invention relates to a packaging technology that utilizes compression for achieving a BGA surface mount-type electrical connection between a microelectronic device and a carrier substrate.

2. State of the Art

A variety of techniques are known in the art for attaching microelectronic devices (such as microprocessors, circuit components, and the like) to carrier substrates (such as motherboards, expansion cards, and the like). These techniques may include direct surface mounting of the microelectronic device to the carrier substrate and socket mounting of the microelectronic device. Socket mounting may comprise a socket mounted on the carrier substrate wherein the microelectronic device is attached to the socket by pins protruding from the microelectronic device, or wherein the microelectronic device is pressed into the socket to achieve electrical continuity between a plurality of lands on the microelectronic device and a plurality of terminals on the socket. However, in low profile applications, such as laptop computers, the height of the attachment of the microelectronic device must be minimized. Thus, sockets are usually not utilized because the socket adds an unacceptable amount of height to the assembly. Thus, for low profile applications, direct surface mounting is generally used.

FIG. 5 illustrates an exemplary surface mounted land grid array 200 comprising a microelectronic device package 208 including a microelectronic device 202 attached to and in electrical contact with a first surface 206 of an interposer substrate 204. The attachment and electrical contact may be achieved through a plurality of small solder balls 212 extending between contacts 214 on the microelectronic device 202 and contacts 216 on the interposer substrate first surface 206. An underfill material 218 may be disposed between the microelectronic device 202 and the interposer substrate 204 to prevent contamination. Further, a thermal interface (shown as heat slug 222) for dissipation of heat generated by the microelectronic device 202 during operation may be attached thereto. The interposer substrate first surface contacts 216 are in discrete electrical contact with contacts 224 on a second surface 226 of the interposer substrate 204 through a plurality of conductive traces (not shown) extending through the interposer substrate 204.

The electrical contact of the microelectronic package 208 to a carrier substrate (such as a motherboard) 232 is achieved with a plurality of solder balls 234 which extend discretely between the interposer substrate second surface contacts 224 and contacts 236 on a first surface 238 of the carrier substrate 232. The solder balls 234 are reflowed (i.e., melted) which attaches the interposer substrate 204 to the carrier substrate 232. This form of electrical attachment is called a ball grid array ("BGA") attachment. The carrier substrate 232 includes conductive traces therein and/or thereon (not shown) which form electrical pathways to connection the first surface contacts 236 with external components (not shown).

The microelectronic device 202 and the interposer substrate 204 may be supported by a support structure 242. The support structure 242 includes a frame 244, a backing plate 246, a thermal plate 248, and a plurality of retention devices (shown as bolts 252 and nuts 254). The backing plate 246 is placed adjacent a second surface 256 of the carrier substrate 232. The frame 244 is placed adjacent to the carrier substrate first surface 238 and at least partially surrounds the microelectronic package 208. The thermal plate 248 abuts the heat slug 222 and extends over the frame 244. The bolts 252 extend through the backing plate 246, the frame 244, and the thermal plate 248, and are retained by nuts 254 threaded thereon. The frame 244 not only acts to support the assembly, but also acts as a stop to prevent overtightening of the retention devices, which could damage the microelectronic device. The thermal plate 248 is generally thermally conductive to assist the heat slug 222 in removing heat generated by the operation of microelectronic device 202.

Although the surface mounted land grid array 200 shown in FIG. 4 achieves a low profile, the attachment of the microelectronic device package 208 to the carrier substrate 232 by reflowing of the solder balls 234 makes it difficult to remove the microelectronic device package 208 after attachment. This, in turn, makes it difficult to replace a defective microelectronic device (resulting in high rework costs) and makes it difficult for an end user or retailer to upgrade the microelectronic device.

Therefore, it would be advantageous to develop new apparatus and techniques to provide a low profile microelectronic device attachment which allows for easy removal of the microelectronic device.

SUMMARY OF THE INVENTION

The present invention relates to a packaging technology that achieves a BGA surface mount-type electrical connection between a first substrate and a second substrate by pressure on the BGA solder balls rather than by the reflow thereof. An embodiment of the present invention includes a microelectronic component assembly comprising a first substrate having at least one contact and a second substrate having at least one contact. At least one solder ball extends between the first substrate contact and the second substrate contact, wherein the solder ball is attached to the first substrate contact. A compression mechanism imparts pressure between the first substrate and the second substrate.

BRIEF DESCRIPTION OF THE DRAWINGS

While the specification concludes with claims particularly pointing out and distinctly claiming that which is-regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although FIGS. 1, 2a–2g, and 3 illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation. Further, it is noted that the term "substrate", as used in the present application, includes but is not limited to carrier substrates, interposer substrates, microelectronic devices (semiconductor chips and the like), and combinations of interposer substrates and microelectronic devices.

This present invention provides a surface mount-type microelectronic component assembly which does not physically attach the microelectronic component to its carrier substrate. Electrical contact is achieved between the microelectronic component and the carrier with solder balls attached to either the microelectronic component or the carrier substrate. A force is exerted on the assembly to achieve sufficient electrical contact between the microelectronic component and the carrier substrate. Thus, the present invention has advantages of a surface mounted assembly (low mounted height and low inductance due to a short electrical path between microelectronic component and carrier substrate), while also having the advantages of a socket-type assembly (easy removal and/or replacement of the microelectronic component).

Figure 1:
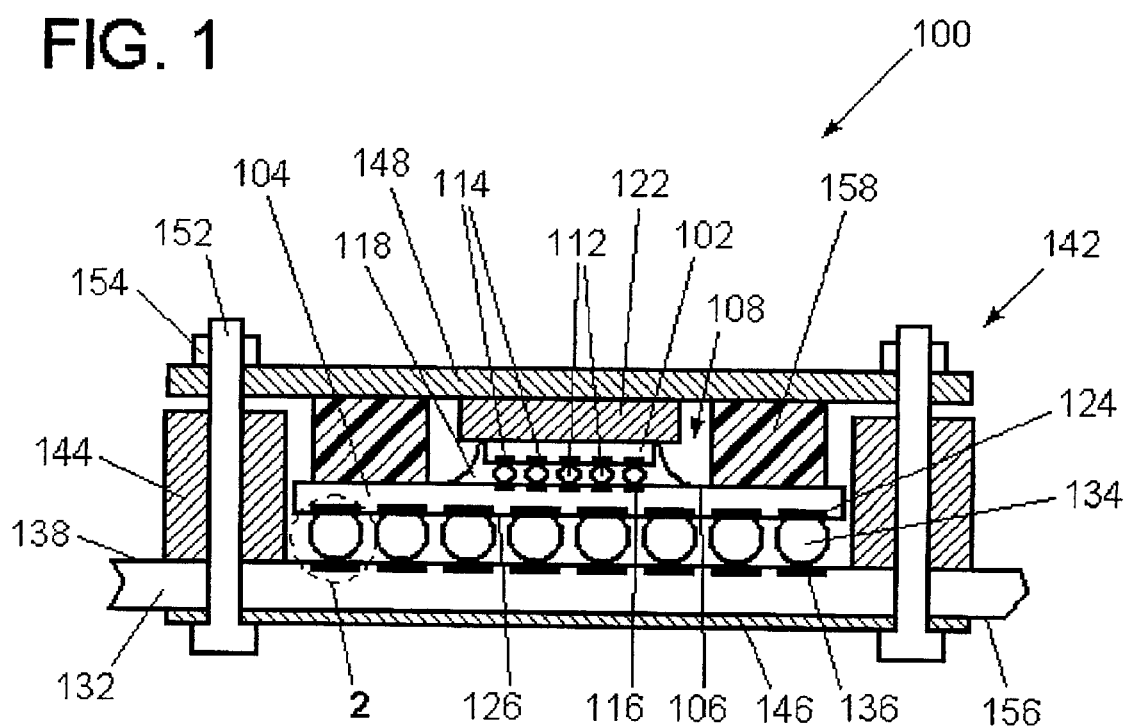
FIG. 1 is a side cross-sectional view of an embodiment of a microelectronic device assembly, according to the present invention.

FIG. 1 illustrates a microelectronic component assembly 100 according to one embodiment of the present invention. The microelectronic component assembly 100 includes a microelectronic device package 108 comprising a microelectronic device 102 attached to and in electrical contact with a first surface 106 of an interposer substrate 104. The attachment and electrical contact is achieved through a plurality of small solder balls 112 extending between contacts 114 on the microelectronic device 102 and contacts 116 on the interposer substrate first surface 106. It is, of course, understood that the microelectronic device 102 could be electrically attached to the interposer substrate 104 with a variety of techniques, including but not limited to conductive epoxy interconnects, lead finger connections, TAB connection, wire bonds, etc. An underfill material 118 may be disposed between the microelectronic device 102 and the interposer substrate 104 to prevent contamination. Further, a thermal interface (shown as heat slug 122) for dissipation of heat generated by the microelectronic device 102 during operation may be attached thereto. The interposer substrate first surface contacts 116 are in discrete electrical contact with contacts 124 on a second surface 126 of the interposer substrate 104 through a plurality of conductive traces (not shown) extending through the interposer substrate 104.

The electrical contact of the microelectronic package 108 with a carrier substrate (such as a motherboard) 132 is achieved with a plurality of solder balls 134, which are formed (reflow) on the interposer substrate second surface contacts 124. The solder balls 134 extend discretely between the interposer substrate second surface contacts 124 and contacts 136 on a first surface 138 of the carrier substrate 132. The solder balls 134 are not physically attached to the carrier substrate contacts 136. Rather, the solder balls 134 make electrical contact by being pressed onto the carrier substrate contacts 136 by a support structure 142. The support structure 142 also holds the microelectronic device 102 and the interposer substrate 104 in place. The solder balls 134 and the carrier substrate contacts 136 may be formed from any applicable conductive material and may include, but is not limited to lead, tin, indium, gallium, bismuth, cadmium, zinc, copper, gold, silver, antimony, germanium, and alloys thereof., As contact resistance is a factor in the present invention, it is preferred that the solder balls 134 and the carrier substrate contacts be made of gold or plated with gold. With regard to the solder balls 134, at least a portion of the solder ball 134 which will contact the carrier substrate contacts 136 is preferably plated with gold. Of course, the gold plating must be sufficiently thick so that the gold does not completely diffuse into the solder ball 134 or into the carrier substrate contact 136 during the lifetime of the microelectronic component assembly 100.

The support structure 142 includes a frame 144, a backing plate 146, a thermal plate 148, and a plurality of retention devices (shown as bolts 152 and nuts 154). The backing plate 146 is placed adjacent a second surface 156 of the carrier substrate 132. The frame 144 is placed adjacent to the carrier substrate first surface 138 and at least partially surrounds the microelectronic device package 108. The frame 144 is preferably designed to reside close to the interposer substrate 104 (i.e., minimum clearance between the frame 144 and the interposer substrate 104). The minimum clearance allows the frame 144 to align the solder balls 134 with their respective carrier substrate contacts 136. Furthermore, the frame 144 will act as a stop tp prevent overtightening of the support structure 142.

The thermal plate 148 abuts the heat slug 122 and extends over the frame 144. The bolts 152 extend through the backing plate 146, the frame 144, and the thermal plate 148, and are retained by nuts 154 threaded thereon. The thermal plate 148, the frame 144, and backing plate 146 are preferably made of substantially rigid material, such as metal (e.g., aluminum), so that each are rigid enough not to flex or deform under pressure (approximately 22.68 kgf (50 lbf) or greater), as discussed below.

The thermal plate 148 is preferably thermally conductive to assist the heat slug 122 in removing heat generated by the operation of microelectronic device 102. It is, of course, understood that the heat slug 122 may not be necessary, as the thermal plate 148 may directly abut the microelectronic device 102 to dissipate the heat generated therefrom.

The support structure 142 further includes a resilient spacer 158 disposed between the interposer substrate first surface 106 and the thermal plate 148. The resilient spacer 158 is used to more evenly distribute pressure imposed by the support structure 142 across the interposer substrate 104. The resilient spacer 158 may be made of any appropriate resilient material, including but not limited to rubber, foam, elastomer, polymer materials, and the like. The support structure 142 is, thus, a compression mechanism for imparting pressure between the interposer substrate 104 and the carrier substrate 132. The pressure imposed on the resilient spacer 158 and the thermal interface is regulated by tightening or loosening the nuts 154 on the bolts 152, subject to a height of the frame 144 and the resilience of the resilient spacer 158. The pressure imposed on the resilient spacer 158 and the thermal interface presses the solder balls 134 against the carrier substrate contacts 136, which allows the solder balls 134 to achieve sufficient electrical contact with the carrier substrate contacts 136 without having to reflow the solder balls 134.

Figure 2A:
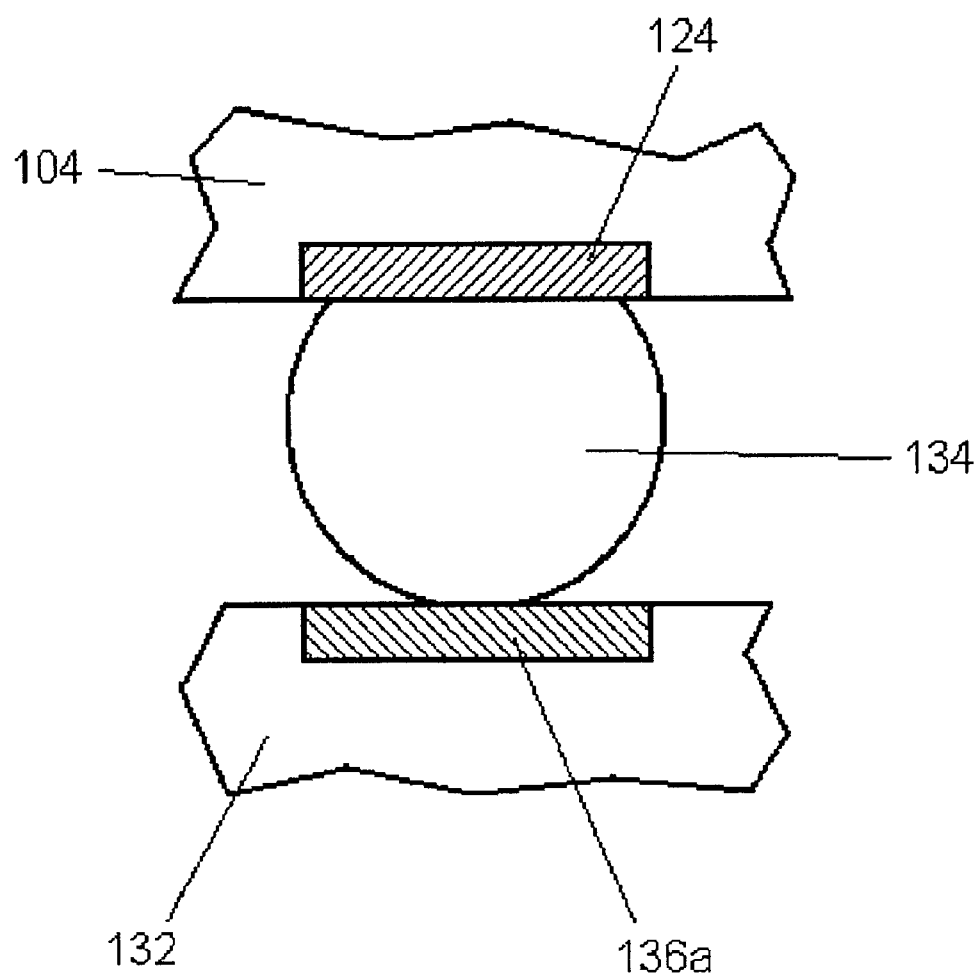
FIGS. 2a–2g are side cross-sectional views of alternate embodiments of contact configurations, according to the present invention.

The carrier substrate contacts 136 may have a variety of configurations. FIGS. 2a–2e are enlargements of inset 2 of FIG. 1 and illustrate a few of such configurations. As shown in FIG. 2a, carrier substrate contacts 136a may be substantially planar, wherein the solder ball 134 is pressed against a first surface 162 of the planar carrier substrate contact 136a.

Although, the use of a substantially planar carrier substrate contacts 136a, as shown in FIG. 2a, is typical in current carrier substrate designs, a planar carrier substrate contact 136*a* may not achieve a sufficient electrical contact with the solder ball 134 due to the low surface area of contact therebetween (i.e., the contact resistance is too high). Furthermore, since most ball grid arrays do not have perfectly matched solder ball sizes (i.e., the solder balls are not coplanar across there contact surfaces), smaller solder balls in the grid array are less likely to achieve a sufficient electrical contact. FIGS. 2*b*–2*e* illustrate various configurations for the carrier substrate contact which will increase the contact surface area between the solder balls and the carrier substrate contacts and/or reduce the effects of non-coplanarity, thereby lowering the contact resistance.

Figure 2B:
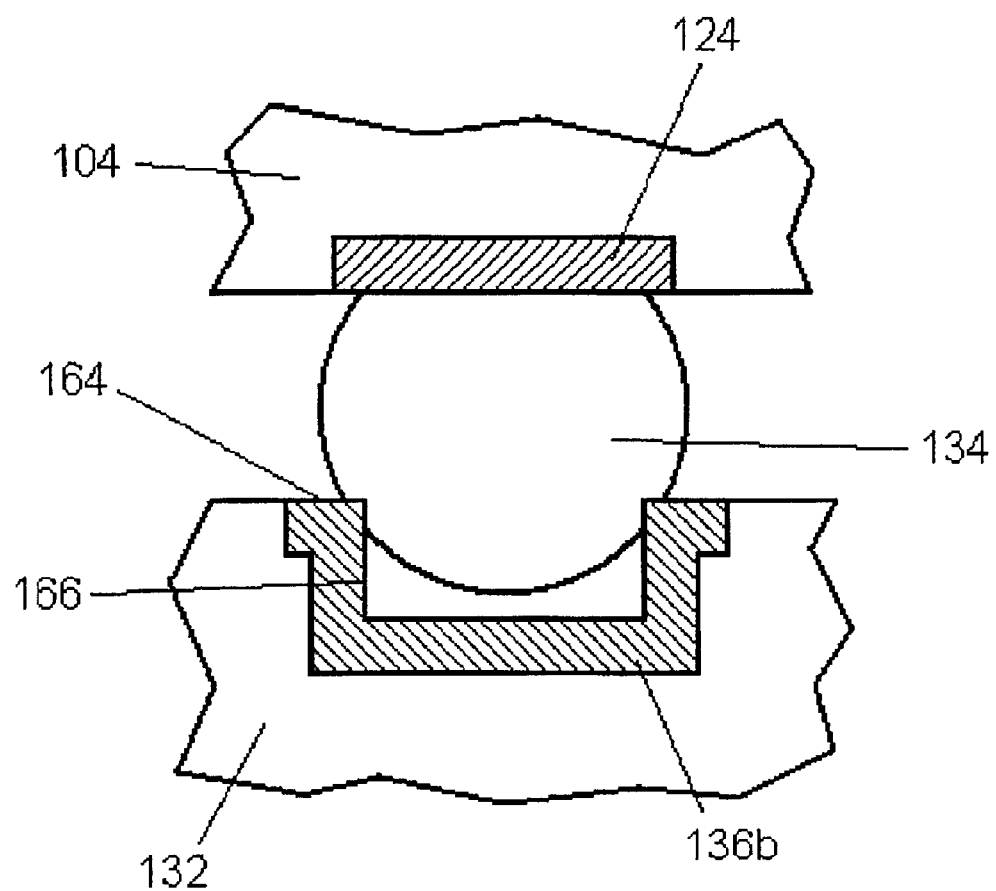

As shown in FIG. 2*b*, a carrier substrate contact 136*b* may be a narrow recess, wherein the solder ball 134 is pressed against and deformed to contact upper planar surfaces 164 and sidewalls 166 of the narrow recess carrier substrate contact 136*b*. Such a configuration provides a higher surface area contact of the solder ball 134 to the narrow recess carrier substrate contact 136*b* than the planar carrier substrate contact 136*a* of FIG. 2*a*. Furthermore, this design allows taller/larger solder balls in a non-coplanar array to be compressed farther into the narrow recess carrier substrate contact 136*b* which allows shorter/smaller solder balls to achieve sufficient electrical contact.

Figure 2C:
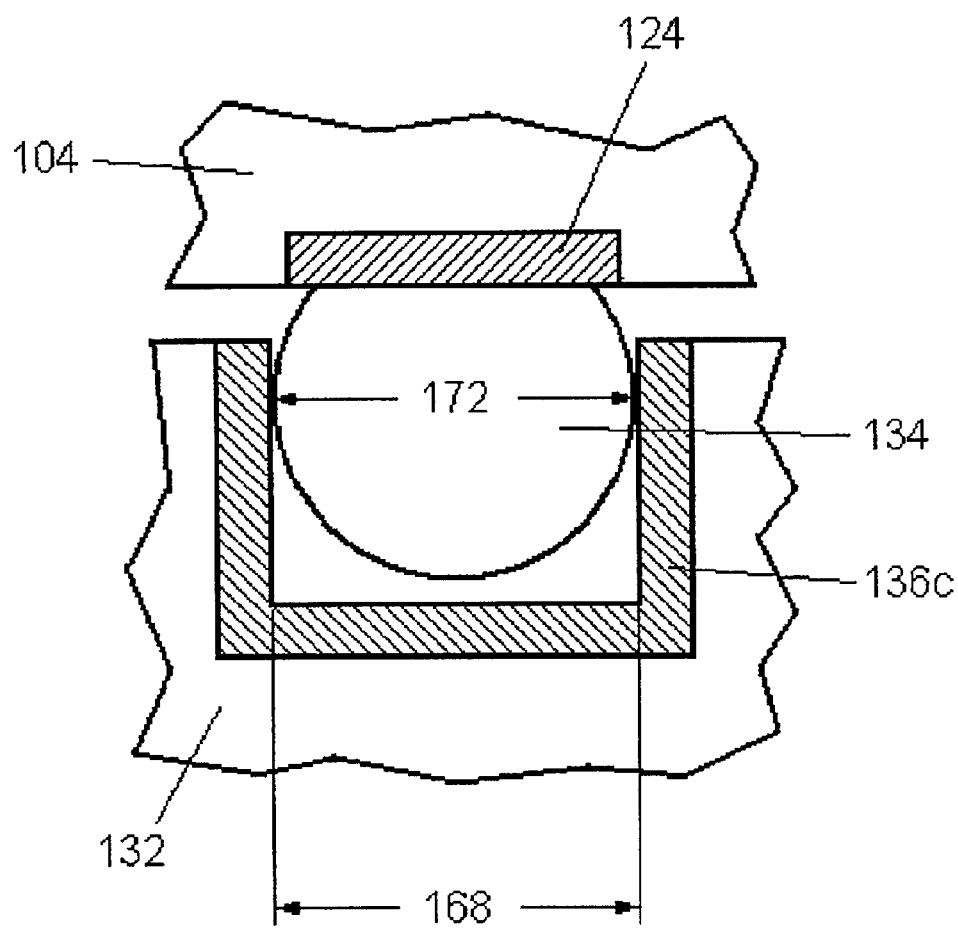

As FIG. 2*c* illustrates, wide recess carrier substrate contacts 136*c* may be fabricated to have substantially vertical sidewalls 166 and having a width 168 which is substantially the same or only slightly smaller than a diameter 172 of the solder balls 134. This contact design allows the solder ball 134 to slide into the wide recess carrier substrate contact 136*c*. It is preferred the solder ball 134 and/or the sidewalls 166 be deformable to allow the solder ball 134 to easily slide into the wide recess carrier substrate contact 136*c*. Such a configuration provides a high surface area contact between the solder ball 134 to the sidewalls 166. Furthermore, this design also allows taller/larger solder balls in a non-coplanar array to be extend farther into the wide recess carrier substrate contact 136*c* which allows shorter/smaller solder balls to achieve sufficient electrical contact.

Figure 2D:
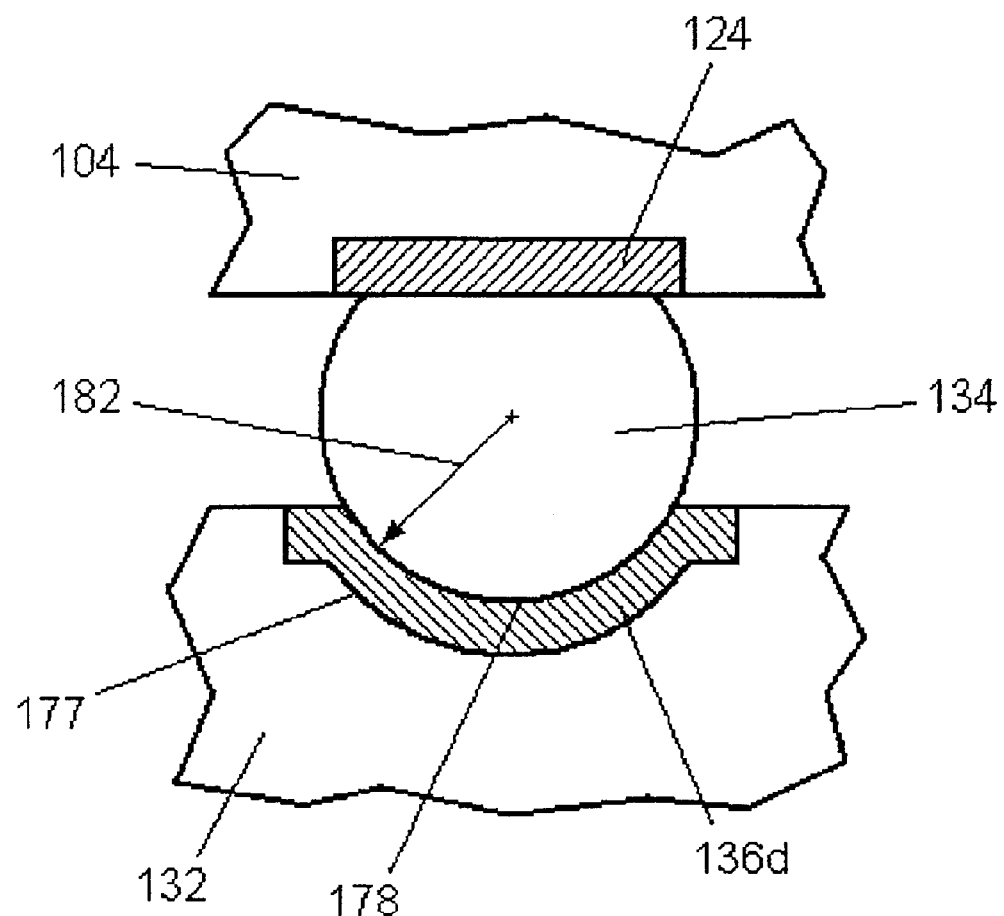
Figure 2E:
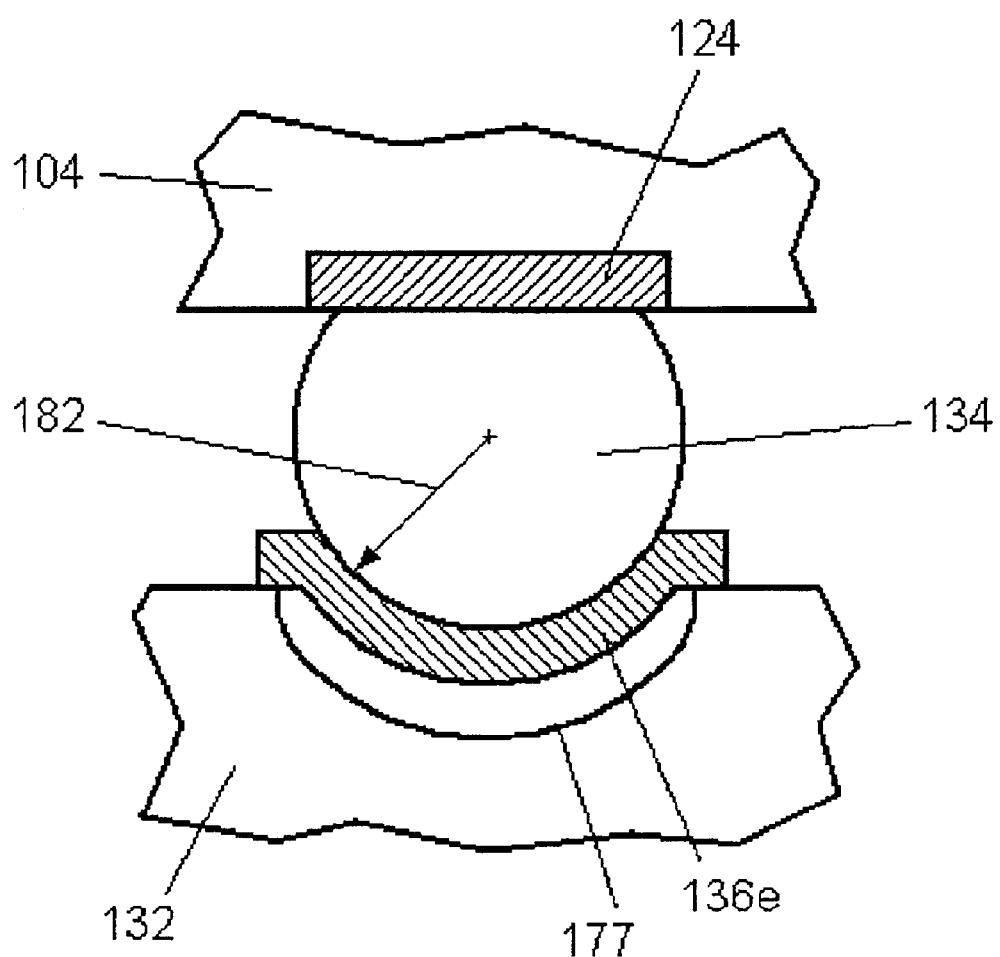
Figure 2F:
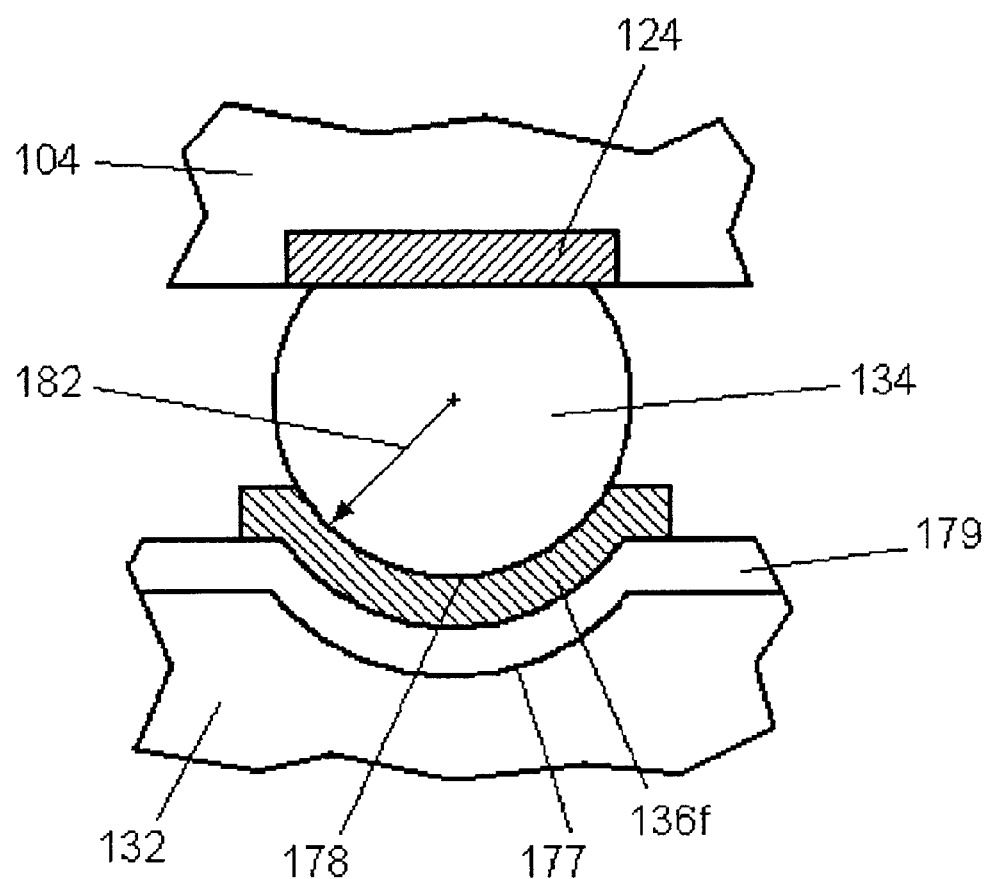

As shown in FIG. 2*d*, carrier substrate contacts 136d may be substantially cup-shaped (i.e., semispherical), wherein the solder ball 134 is pressed against a curved surface 178 of the carrier substrate contact 136*d* residing within a semispherical recess 177 formed in the carrier substrate 132. The curved surface 178 is preferably configured to have a radius that substantially matches the radius of the solder ball 134 (both radii illustrated as element 176). Such a configuration provides high surface area contact of the solder ball 134 with the cup-shaped carrier substrate contact 136*d*. However, the configuration in FIG. 2*d* does not compensate for non-coplanarity of the solder balls 134. Thus, FIG. 2*e* illustrates an embodiment wherein the semispherical recess 177 is formed in the substrate 104 with a carrier substrate contact 136*e* extending over the semispherical recess 177 to form a void. Thus, the solder 134 and the carrier substrate contact 136*e* flex into the semispherical recess 177 when pressure is imparted thereon, which compensates for the non-coplanarity of the solder balls 134. FIG. 2*f* illustrates another embodiment wherein a resilient material layer 179 is disposed between the semispherical recess 177 and the carrier substrate contact 136*f*, wherein the resilient material layer 179 will flex to compensate for the non-coplanarity of the solder balls 134.

Figure 2G:
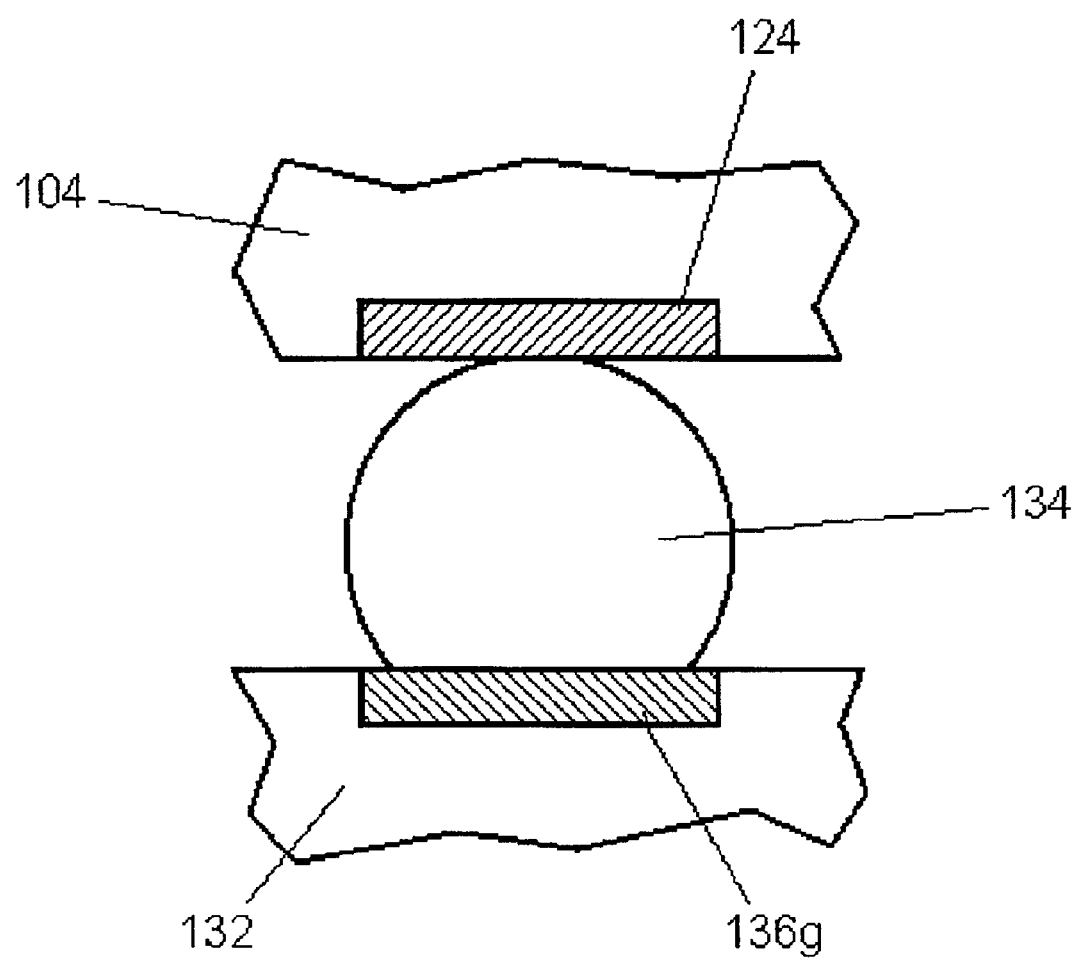

It is, of course, understood that the contact configuration can be reversed. For example, as shown in FIG. 2*g*, the solder balls 134 may be formed (reflowed) on the contact 136*g* of the carrier substrate 132, wherein the solder balls 134 are pressed into the interposer substrate second surface contacts 124. It is believe the forming the solder balls 134*g* on the carrier substrate 132 will result in a higher coplanarity (i.e., even solder ball height) the forming the solder balls on the interposer substrate 104. Of course, the interposer substrate second surface contacts 124 may also have a variety of configurations, such as illustrated for the carrier substrate contacts 136*a*–136*f* (FIGS. 2*a*–2*f*, respectively).

It is also understood that the configurations are not limited to the configurations illustrated in FIGS. 2*a*–2*g*, but may have any acceptable configuration that can be devised by one skilled in the art.

Figure 3:
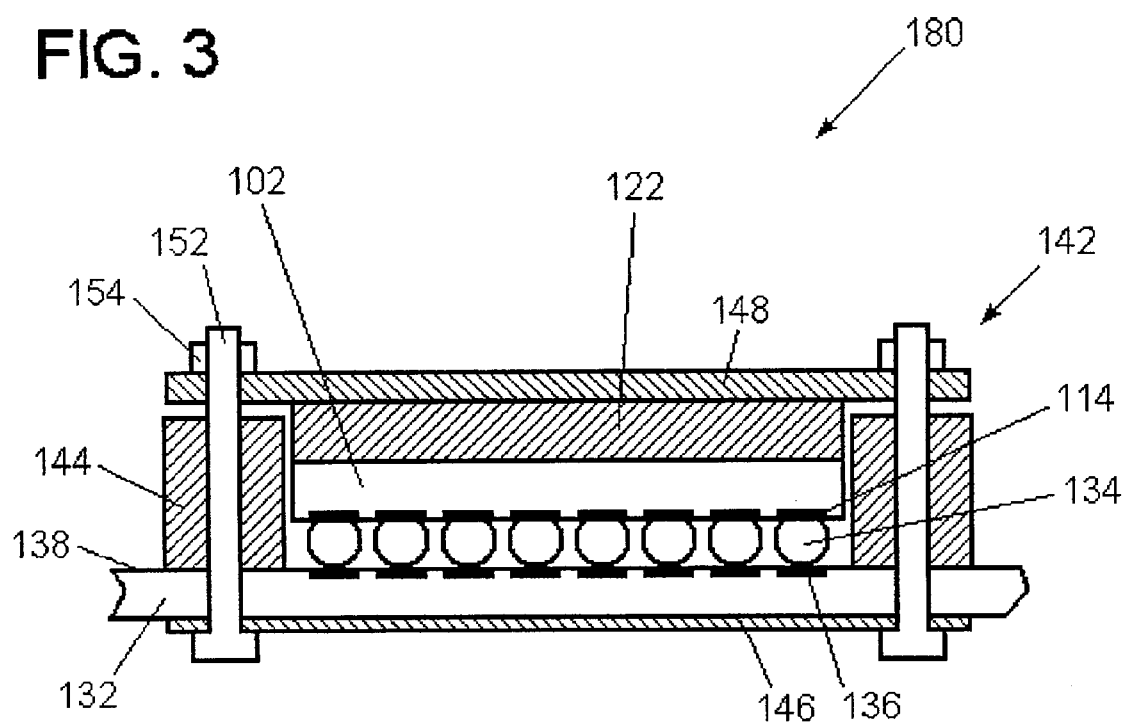
FIG. 3 is a side cross-sectional view of another embodiment of a microelectronic device assembly, according to the present invention.

It is, of course, understood that the present invention is not limited to attachment of an interposer substrate to a carrier substrate. The present invention may also be utilized to directly attach a microelectronic device (also broadly defined as a "substrate") to a carrier substrate. FIG. 3 illustrates such a microelectronic component assembly 180 wherein the microelectronic device 102 is attached to and in electrical contact with the contacts 136 on the first surface 138 of the carrier substrate 132. The attachment and electrical contact is achieved through a plurality of solder balls 134 formed (reflowed) on the microelectronic device contacts 114 which physically contact the carrier substrate contacts 136. A thermal interface (shown as heat slug 122) for dissipation of heat generated by the microelectronic device 102 during operation may be attached to the microelectronic device 102. As with the embodiment illustrated in FIG. 1, the support structure 142 provides the pressure for achieving the electrical contact between the microelectronic device 102 and the carrier substrate 132. However, the resilient spacer 158, as shown in FIG. 1, is not required as the support structure 142 will inherently distribute the pressure substantially evenly across the microelectronic device 102. It is, of course, understood that either the microelectronic device contacts 114 or the carrier substrate contacts 136 may have a variety of configurations, such as illustrated in FIGS. 2*a*–2*g*.

A bench test was run in which an organic land grid array having 615 gold coated solder balls (30 mils in diameter with about 10 microinches of gold plating) was pressed against a test board which had corresponding gold coated planar contacts (about 10 microinches of gold plating). An electrical continuity across the solder ball-to planar contact junctions of about 57% was achieved at about 37, 52, and 67 gramf/solder ball nominal applied force. Of course, the bench test was not optimized. Rather the bench test was run for concept validation only. However, it is believed that an optimized configuration would achieve a solder ball-to-contact resistance below 20 mOhms with an applied force of about 35 gramf/solder ball or greater.

Figure 4:
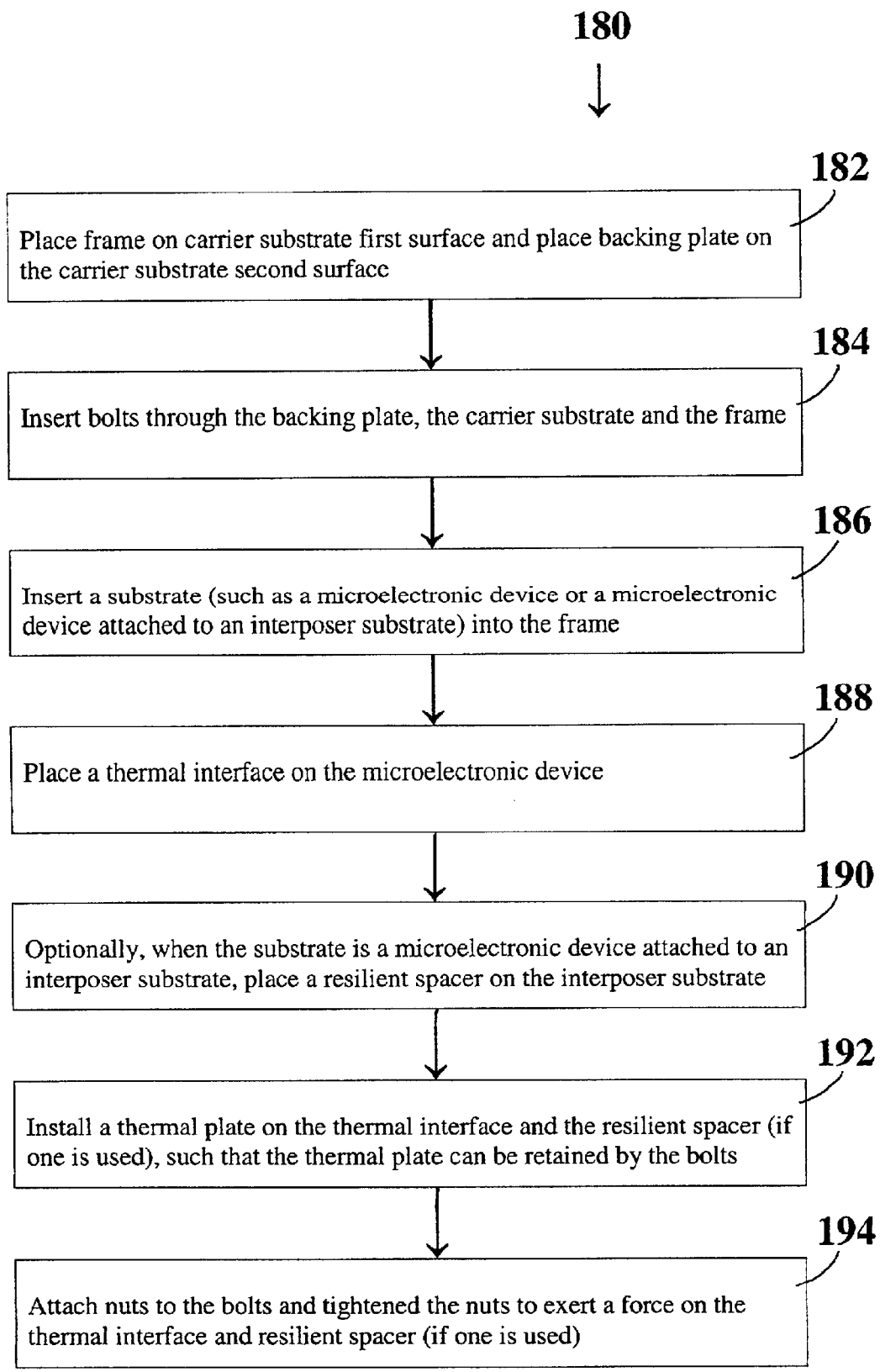
FIG. 4 is a flow chart illustrating a process for forming a microelectronic device assembly, according to the present invention.
Figure 5:
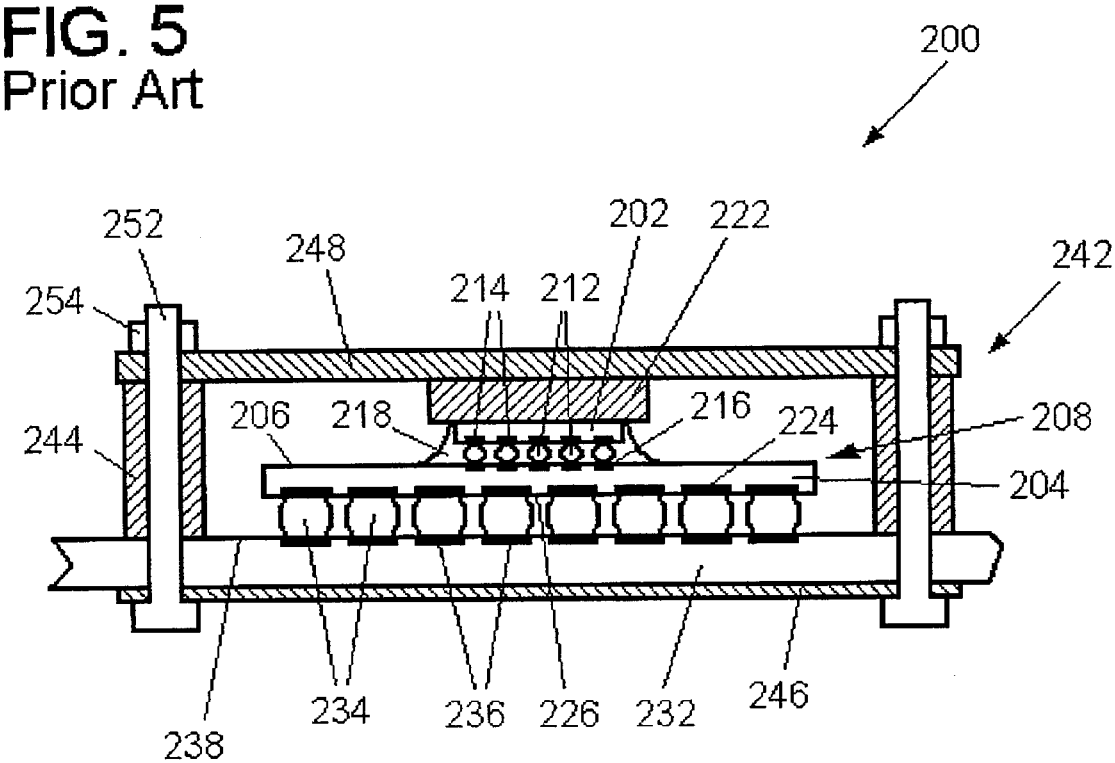
FIG. 5 is a cross-sectional view of a microelectronic device assembly, as known in the art.

FIG. 4 is a flowchart of a method 180 of fabricating a microelectronic device assembly of the present invention. As described in box 182, the frame is placed on the first surface of the carrier substrate and the backing plate is place on the second surface of the carrier substrate. As described in box 184, bolts are inserted through the backing plate, the carrier substrate and the frame. A substrate (such as a microelectronic device or a microelectronic device attached to an interposer substrate) is then inserted into the frame, as described in box 186, wherein the frame guides the substrate into alignment. This alignment positions the contacts of the substrate to match the location of the contacts on the carrier substrate. Thus, solder balls formed on the substrate contacts come into discrete physical contact with the carrier substrate contracts, or solder balls formed on the carrier substrate contacts come into discrete physical contact with the substrate contracts.

As described in box 188, a thermal interface is then place on the microelectronic device. Optionally, when the substrate is a microelectronic device attached to an interposer substrate, a resilient spacer is place on the interposer substrate, as described in box 190. A thermal plate is installed on top of the thermal interface and the resilient spacer (if one is used), such that the thermal plate can be retained by the bolts, as described in box 192. As described in box 194, nuts are attached to the bolts and tightened to exert a force on the thermal interface and resilient spacer (if one is used). This force is translated through the assembly to press the solder balls into electrical contact, as previously discussed.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic component assembly, comprising:
    a substrate having at least one contact;
    a motherboard hat at least one contact;
    at least one solder ball extending between said at least one substrate contact and said at least one motherboard contact, wherein said at least one solder ball is attached to one of said at least one substrate contact and said at least one motherboard contact;
    wherein said at least one of said at least one substrate contact and said at least one motherboard contact is recessed and has a semispherical surface which is substantially the same radius as a radius of said solder ball; and
    a compression mechanism for imparting pressure between said substrate and said motherboard.

2. The microelectronic component assembly of claim 1, wherein said substrate comprises a microelectronic device package.

3. The microelectronic component assembly of claim 1, wherein said substrate comprises a microelectronic device.

4. A microelectronic component assembly, comprising:
    a substrate having a first surface and a second surface, wherein said first substrate first surface includes at least one contact;
    a motherboard having a first surface and a second surface; wherein said motherboard first surface includes at least one contact;
    at least one solder ball extending between said at least one substrate first surface contact and said at least one motherboard first surface contact, wherein said at least one solder ball is attached to one of said at least one substrate first surface contact and said at least one motherboard first surface contact;
    wherein said at least one of said at least one substrate contact and at least one motherboard contact is recessed and has a semispherical surface which is substantially the same radius as a radius of said solder ball; and
    a support structure for imparting pressure between said substrate and said motherboard.

5. The microelectronic component assembly of claim 4, wherein said support structure comprises:
    a frame surrounding a portion of said substrate,
    a backing plate abutting said motherboard;
    a thermal plate extending over said frame and adjacent said substrate second surface; and
    a plurality of retention devices extending through said backing plate, said frame, and said thermal plate.

6. The microelectronic component assembly of claim 5, wherein said plurality of retention device comprise a plurality of bolts having at least one nut retaining each of said plurality of bolts.

7. The microelectronic component assembly of claim 4, wherein said substrate comprises a microelectronic device package including a microelectronic device attached to and in electrical contact with a first surface of an interposer substrate, and wherein said at least substrate first surface contact comprises at least one contact on a second surface of said interposer substrate.

8. The microelectronic component assembly of claim 7, wherein said support frame comprises
    a frame surrounding a portion of said substrate,
    a backing plate abutting said motherboard second surface;
    a thermal plate extending over said frame and adjacent said substrate second surface;
    a plurality of retention devices extending through said backing plate, said frame, and the thermal plate; and
    a resilient spacer extending between said thermal plate and said interposer substrate.

9. A substrate contact for forming a non-reflow electrical contact with a solder ball, comprising;
    a recess defined in a substrate by at least one surface extending into said substrate; and
    a conductive material layered over said recess forming a void therebetween, wherein said conductive material forms a semispherical surface which substantially conforms to the surface of said solder ball.

10. A substrate contact for forming a non-reflow electrical contact with a solder ball, comprising:
    a semispherical recess defined in a substrate by at least one surface extending into said substrate;
    a conductive material layered in said semispherical recess; and
    an upper surface of said conductive material layer having a radius which is substantially the same as a radius of said solder ball.

11. The substrate contact of claim 10, further including a resilient material disposed between said substrate and said conductive material layer.

* * * * *

UNITED STATES PATENT AND TRADEMARK OFFICE
CERTIFICATE OF CORRECTION

PATENT NO.   : 6,750,551 B1　　　　　　　　　　　　　　　　　　　　　　　　Page 1 of 1
DATED        : June 15, 2004
INVENTOR(S)  : Frutschy et al.

It is certified that error appears in the above-identified patent and that said Letters Patent is hereby corrected as shown below:

Column 3,
Line 67, delete "thereof.," and insert -- thereof. --.

Column 7,
Line 25, delete "hat" and insert -- having --.

Signed and Sealed this

Fourth Day of January, 2005

JON W. DUDAS
*Director of the United States Patent and Trademark Office*